United States Patent

Kawase

[11] Patent Number: 6,028,427
[45] Date of Patent: Feb. 22, 2000

[54] MAGNETISM SENSOR USING A MAGNETISM DETECTING DEVICE OF A MAGNETIC IMPEDANCE EFFECT TYPE AND CONTROL APPARATUS USING THE SAME

[75] Inventor: Masahiro Kawase, Higashimatsuyama, Japan

[73] Assignee: Canon Denshi Kabushiki Kaisha, Saitama-Ken, Japan

[21] Appl. No.: 09/057,099

[22] Filed: Apr. 8, 1998

Related U.S. Application Data

[62] Division of application No. 08/736,396, Oct. 24, 1996, Pat. No. 5,764,055.

[30] Foreign Application Priority Data

Feb. 11, 1995 [JP] Japan ................... 7-285476

[51] Int. Cl.[7] .................................................. G01R 33/02
[52] U.S. Cl. ............................................ 324/249; 324/260
[58] Field of Search ................... 324/244, 249, 324/250, 252, 260; 360/110, 113

[56] References Cited

U.S. PATENT DOCUMENTS

| | | | |
|---|---|---|---|
| 3,260,932 | 7/1966 | Weiss et al. | 324/252 |
| 4,079,360 | 3/1978 | Ookubo et al. | 324/252 X |
| 5,764,055 | 6/1998 | Kawase | 324/249 |
| 5,889,403 | 3/1999 | Kawase | 324/249 |
| 5,903,414 | 5/1999 | Kawase | 360/110 |

Primary Examiner—Gerard Strecker
Attorney, Agent, or Firm—Robin, Blecker & Daley

[57] ABSTRACT

A magnetism detecting device of a magnetic impedance effect type includes a high-permeability magnetic film formed on a side of an approximately rectangular parallelepipedic, non-magnetic substrate. The high-permeability magnetic film is formed as a folded pattern having end portions extending in opposite directions and at least one folded portion disposed between the end portions, a longitudinal direction of the high-permeability magnetic film being parallel to a magnetic-field detecting direction. The high-permeability magnetic film is imparted magnetic anisotropy so that a direction of an axis of easy magnification of the high-permeability film is perpendicular to the longitudinal direction of the high-permeability magnetic film in a film plane thereof. Conductive films are formed at both ends of the high-permeability magnetic film as terminals. The high-permeability magnetic film and the conductive films are formed on the side of the non-magnetic substrate, which side is approximately perpendicular to a surface of a printed circuit board, so that the conductive films are directly soldered to a wiring pattern on the printed circuit board on which to mount the magnetism detecting device.

7 Claims, 8 Drawing Sheets

MAGNETISM SENSOR USING A MAGNETISM DETECTING DEVICE OF A MAGNETIC IMPEDANCE EFFECT TYPE AND CONTROL APPARATUS USING THE SAME

CROSS-REFERENCE TO RELATED APPLICATIONS

This application is a divisional of application Ser. No. 08/736,396, filed Oct. 24, 1996 now U.S. Pat. No. 5,764,055.

BACKGROUND OF THE INVENTION

1. Field of the Invention

The present invention relates to a magnetism detecting device which makes use of a magnetic impedance effect, a magnetism sensor using the magnetism detecting device, and a terrestrial-magnetism detecting azimuth sensor and an attitude controlling sensor both of which use the magnetism sensor.

2. Description of Related Art

A conventional general type of terrestrial-magnetism detecting azimuth sensor (hereinafter referred to as the azimuth sensor) is a flux gate sensor. This sensor includes an easily saturable annular core around which an exciting coil is toroidally wound, and a pair of detecting coils disposed in such a manner as to intersect at right angles to each other above the annular core. The sensor obtains a vector quantity from two horizontal components of force and detects an azimuth angle.

However, the fluxgate sensor cannot be reduced in size, and needs an exciting current so that a magnetic element can be used in a saturated state. Accordingly, if such a fluxgate sensor is to be incorporated into portable equipment, the fluxgate sensor cannot be reduced in size beyond a certain limit.

For these reasons, a magnetism detecting device (hereinafter referred to as the MI device), disclosed in Japanese Laid-Open Patent Application No. Hei 7-181239, which makes use of a magnetic impedance effect due to amorphous wire has recently become known. The magnetic impedance effect is the phenomenon in which if a high-frequency current of MHz frequency band flows through a magnetic element, the impedance of the magnetic element varies due to an external magnetic field so that the amplitude of the voltage across the magnetic element varies up to some tens of percent due to a small magnetic field of approximately several gausses. This MI device has a detection sensitivity equal to that of the fluxgate sensor and can be applied to an azimuth sensor. An application of the MI device to the azimuth sensor is stated in "Colpitts Oscillation Type of Magnetism Microsensor Using Amorphous-Wire MI Device" announced at a lecture to the 18th meeting of The Japan Society of Applied Magnetics (14pB-7).

The arrangement of this azimuth sensor is such that an amorphous wire is incorporated in a Colpitts oscillator so that a variation in an external magnetic field appears as a variation in an oscillation amplitude and the variation in the oscillation amplitude is provided as an output from an envelope detecting circuit. Incidentally, to discriminate between south and north, a direct-current bias magnetic field is applied to the device by causing a direct current to flow through a coil directly wound around the wire of the device.

However, to put the aforesaid azimuth sensor into practice, it is considered to be necessary to solve problems which will be stated below.

1) Amorphous wire makes it difficult to mount an oscillator on a printed circuit board by direct soldering. In addition, since amorphous wire is easily bent, handling is difficult in terms of maintainability of its straight shape and the like.

2) Since a variation in the absolute value of an amplitude voltage of an oscillation circuit is handled as a sensor output, the sensor output is susceptible to amplitude variations due to variations in source voltage or the temperature characteristics or the like of other electrical elements.

3) Since terrestrial magnetism is weak, a variation in a detected signal is as small as several percent and is susceptible to noise.

4) Fine adjustment of the oscillation amplitude is needed, and it is difficult to adjust X- and Y-axis sensitivities to each other.

BRIEF SUMMARY OF THE INVENTION

It is, therefore, an object of the present invention to solve the above-described problems.

Another object of the present invention is to provide an MI device which is easy to handle and can be miniaturized, and is suitable for use in a magnetism sensor used in an azimuth sensor.

Another object of the present invention is to provide a magnetism sensor using such MI device, as well as an azimuth sensor and an attitude controlling sensor each of which uses such magnetism sensor, any of the sensors being insusceptible to not only noise but also variations in source voltage, the temperature characteristics of electrical elements or the like, and being capable of omitting fine adjustment of an oscillation circuit.

To achieve the above objects, in accordance with one aspect of the present invention, there is provided an MI device which comprises a high-permeability magnetic film formed on a side of an approximately rectangular parallelepipedic, non-magnetic substrate, the high-permeability magnetic film being formed as a folded pattern having end portions extending in opposite directions and at least one folded portion disposed between the end portions in opposite directions, a longitudinal direction of the high-permeability magnetic film being parallel to a magnetic-field detecting direction and the high-permeability magnetic film being imparted magnetic anisotropy so that a direction of an axis of easy magnetization of the high-permeability magnetic film is perpendicular to the longitudinal direction of the high-permeability magnetic film in a film plane thereof, and conductive films formed at both ends of the high-permeability magnetic film as terminals, the high-permeability magnetic film and the conductive films being formed on the side of the non-magnetic substrate, which side is approximately perpendicular to a surface of a printed circuit board, so that the conductive films are directly soldered to a wiring pattern on the printed circuit boardon which to mount the MI device.

In accordance with the aforesaid arrangement, since the essential device portion of the device is made from the magnetic film, handling is easy. In addition, owing to the folded pattern, even if the overall length of the magnetic film is extended, the entire length of the device can be reduced and the device itself can be miniaturized like a chip resistor or a chip capacitor, so that a magnetism sensor using such device can be miniaturized. In addition, since the device can be soldered to the printed circuit board, mounting of the device can readily be carried out.

In accordance with another aspect of the present invention, there is provided a magnetism sensor which comprises an MI device and a coil wound around the MI device and is arranged to cause a high-frequency drive current to flow through the MI device, cause an alternating bias current having a frequency lower than the high-frequency drive current to flow through the coil to apply an alternating-current bias magnetic field to the MI device and cause an impedance variation having a peak of twice the frequency of the alternating bias current to occur in the MI device, cause peaks which alternate between two different heights to occur in the impedance variation according to an external magnetic field, and convert a strength of the external magnetic field into a difference in height between adjacent peaks and detect the difference in height between the adjacent peaks.

In accordance with the aforesaid arrangement, the strength of the external magnetic field is obtained not from the absolute value of the impedance of the MI device but from the difference in height between the adjacent peaks which occur in the impedance variation, so that it is possible to suppress the influence of variations in source voltage or that of the temperature characteristics of other electrical elements.

In one specific arrangement of the aforesaid magnetism sensor, the MI device to which the alternating-current bias magnetic field is to be applied is incorporated as an inductive device for a Colpitts oscillation circuit, and the magnetism sensor causes an envelope detecting circuit to detect an output of the Colpitts oscillation circuit, inputs the detected output into a comparator, and converts into a pulse-width-modulated signal a difference in height between adjacent peaks in an impedance variation, the adjacent peaks occurring in the MI device according to an external magnetic field.

In accordance with the aforesaid arrangement, since the amount of variation in amplitude of the output of the oscillation circuit is handled, no fine adjustment of the oscillation circuit is needed, because the absolute value of amplitude does not directly affect the sensitivity of the magnetism sensor. Since the sensor output signal has a pulse-width-modulated digital waveform, it is insusceptible to noise.

In accordance with another aspect of the present invention, there is provided a terrestrial-magnetism detecting azimuth sensor in which two magnetism sensors each of which is identical to the aforesaid magnetism sensor are used, and the two magnetism sensors are disposed in such a manner that longitudinal directions of the MI devices of the respective two magnetism sensors are perpendicular to each other so that the two magnetism sensors respectively provide outputs relative to X-axis and Y-axis directions, the terrestrial-magnetism detecting azimuth sensor being arranged to obtain numerical values Nx and Ny each of which indicates a difference in pulse width between adjacent pulses which alternately appear in an output signal of a corresponding one of the two magnetism sensors, and calculate an azimuth angle of terrestrial magnetism from the following calculating expression:

$\tan^{-1}(Ny/Nx)$.

In accordance with the above-described arrangement, the strengths of terrestrial magnetism in the X- and Y-axis directions are detected with high sensitivity, and the azimuth angle of terrestrial magnetism can be accurately obtained from the above calculating expression on the basis of the X- and Y-axis strengths.

In accordance with another aspect of the present invention, there is provided an attitude controlling sensor in which the aforesaid magnetism sensor is used, the attitude controlling sensor being arranged to separately extract pulses which alternately appear in an output of the magnetism sensor, perform predetermined processing on each of the pulses, and produce a servo signal for providing attitude control so that a longitudinal direction of the MI device coincides with a direction perpendicular to the external magnetic field so as to make the alternately appearing pulses equal in pulse width to each other.

In accordance with the above-described arrangement, on the basis of the servo signal of the attitude controlling sensor, it is possible to provide attitude control so that the longitudinal direction of the MI device coincides with the direction perpendicular to the external magnetic field.

The above and other objects, features and advantages of the present invention will become apparent from the following detailed description of a preferred embodiment of the present invention, taken in conjunction with the accompanying drawings.

DETAILED DESCRIPTION OF THE INVENTION

A preferred embodiment of the present invention will be described below with reference to the accompanying drawings.

Figure 1:
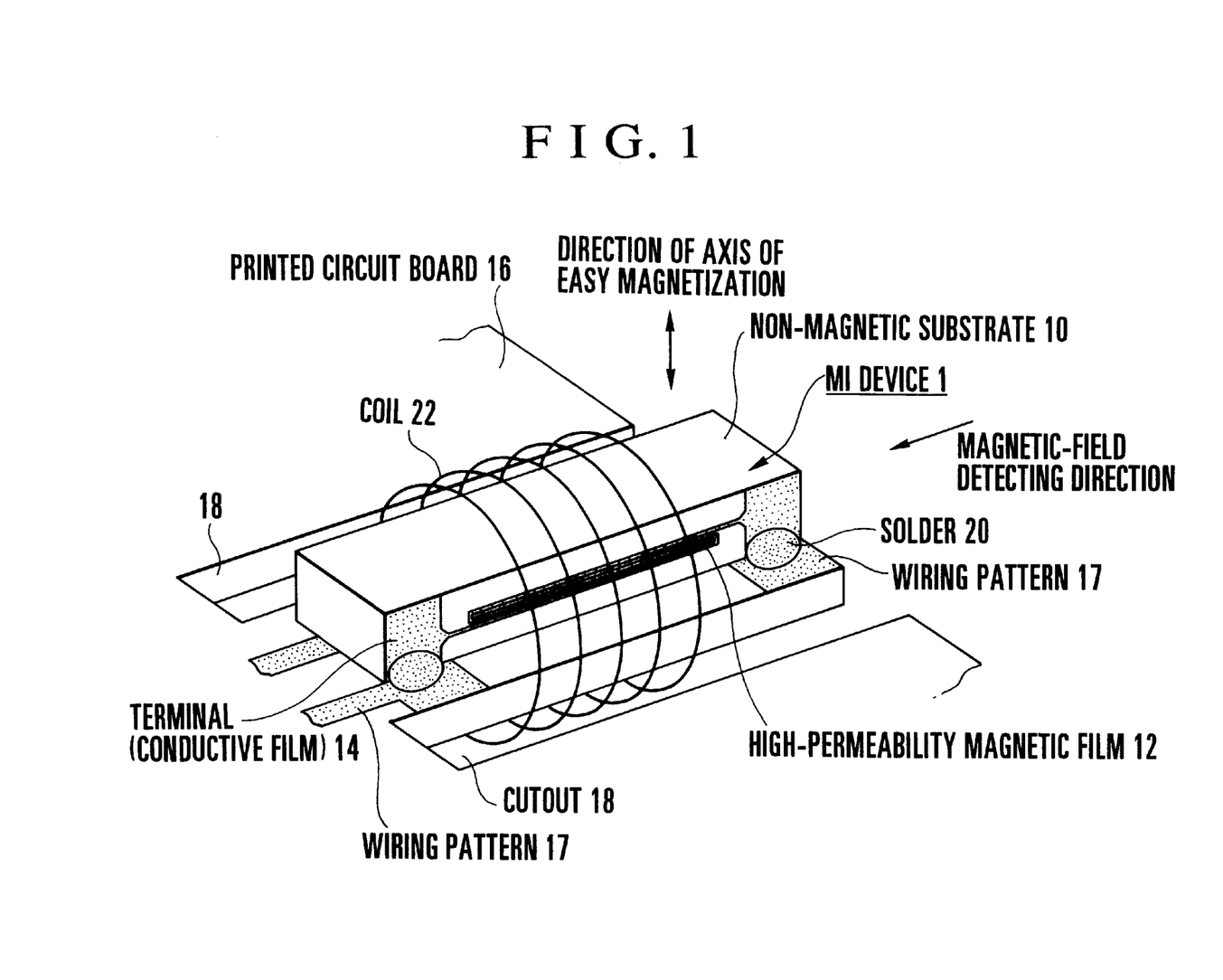
FIG. 1 is a perspective view showing a basic structure of an MI device which constitutes a magnetism sensor for use in an azimuth sensor according to an embodiment of the present invention, as well as the state in which the MI device is mounted on a printed circuit board.

FIG. 1 shows a basic structure of an MI device which constitutes a magnetism sensor for use in an azimuth sensor according to the embodiment of the present invention, and the state in which the MI device is mounted on a printed circuit board.

Referring to FIG. 1, an MI device 1 is mounted on the upper side of a printed circuit board 16.

A non-magnetic substrate (hereinafter referred to as the substrate) 10 constitutes the MI device 1, and is formed as a rectangular parallelepipedic substrate made of a non-magnetic material such as calcium titanate (Ti—Ca ceramics), glass oxide, titania ($TiO_2$) or alumina ($Al_2O_3$).

A high-permeability magnetic film (hereinafter referred to as the magnetic film) 12 is formed on one of the sides of the substrate 10 that are perpendicular to the upper side of the printed circuit board 16, as an essential device portion of the MI device 1. The magnetic film 12 is formed as a folded pattern having end portions extending in opposite directions and at least one folded portion disposed between the end portions in opposite directions. The longitudinal direction of the magnetic film 12 is parallel to the longitudinal direction of the substrate 10, and is also parallel to the magnetic-field detecting direction indicated by the left-headed arrow shown in FIG. 1. The magnetic film 12 is a single-layer film made from a high-permeability magnetic metal film, for example, an Fe—Co—B amorphous film or a microcrystalline film such as an Fe—Ta—N film or an Fe—Ta—C film. In addition, the magnetic film 12 is imparted magnetic anisotropy, as by annealing in a magnetic field after a film forming process, so that the direction of the axis of easy magnetization of the magnetic film 12 is perpendicular to the longitudinal direction of the magnetic film 12 in the film plane thereof, as indicated by the double-headed arrow shown in FIG. 1.

The thickness of the magnetic film 12 is selected to be 1 $\mu$m to 5 $\mu$m, because as the magnetic film 12 becomes thicker, the variation of its Q value (quality factor) becomes smaller, whereas as the magnetic film 12 becomes thinner, the variation of its impedance Z becomes smaller. If the width of the magnetic film 12 is made excessively narrow, the structure of the internal magnetic domains of the magnetic film 12 becomes unstable and hence its magnetic impedance characteristics become unstable. Contrarily, if the width is made excessively wide, the affection of a diamagnetic field becomes large. Therefore, the width of the magnetic film 12 is selected to be 10 $\mu$m to 100 $\mu$m.

Figure 2A:
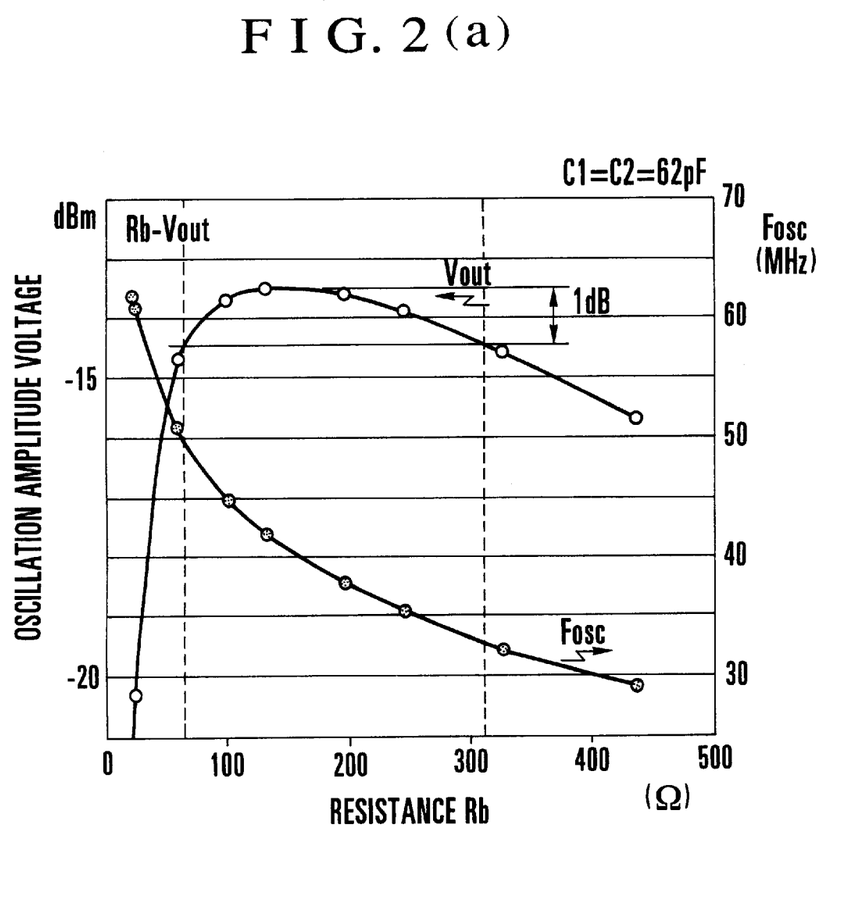
FIG. 2(a) is a graph showing the relation between a resistance and an oscillation amplitude voltage in a Colpitts oscillation circuit.
Figure 2B:
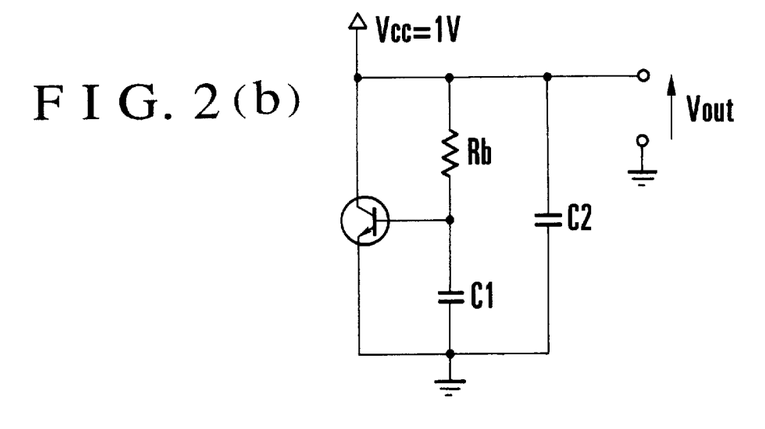
FIG. 2(b) is a circuit diagram of a measuring circuit.

The length of the magnetic film 12 is calculated and determined from the thickness and width of the magnetic film 12 so that the direct-current resistance value across the magnetic film 12 is in the range of 70 $\Omega$ to 300 $\Omega$. The reason why this range is suitable as such resistance value is that the Colpitts oscillator shown in FIG. 2(b) can oscillate by means of only a resistance Rb and capacitors C1 and C2 with respect to a high frequency wave and, as is apparent from FIG. 2(a) which shows the relation between the resistance Rb and an oscillation amplitude voltage Vout, a sufficient oscillation is obtained within the range of approximately 70–310 $\Omega$ between a maximum peak of the oscillation amplitude voltage Vout and a level which is 1 dB lower than the maximum peak, and this relation does not change if the MI device 1 according to the present invention is substituted for the resistance Rb.

Even if the overall length of the magnetic film 12 reaches several millimeters, the length of the MI device 1 can freely be selected to be shorter than the overall length of the magnetic film 12, by folding the magnetic film 12 to have oppositely extending end portions and at least one portion between the end portions. Accordingly, the MI device 1 can be miniaturized like a chip resistor or a chip capacitor.

Referring back to FIG. 1, terminals 14 each of which is made from a conductive film of Cu, Au or the like are respectively formed on both ends of the magnetic film 12 so that the MI device 1 can readily be soldered to the printed circuit board 16 by solder 20.

The process of mounting the MI device 1 on the printed circuit board 16 includes the steps of positioning the MI device 1 on an end portion of the printed circuit board 16 by aligning a predetermined end face of the MI device 1 to an end face of the printed circuit board 16 (as shown in FIG. 1), and directly soldering the terminals 14 formed on one side face of the MI device 1 to a wiring pattern 17 formed on the upper side of the printed circuit board 16, by means of the solder 20, so as to electrically connect the terminals 14 to the wiring pattern 17 and fix the MI device 1 to the printed circuit board 16. In this manner, the MI device 1 can readily be mounted on the printed circuit board 16 by such direct soldering.

Cutouts 18 are respectively formed near both sides of the portion of the printed circuit board 16 on which the MI device 1 is mounted, and a bias coil 22 for generating an alternating-current bias magnetic field is wound around the MI device 1 through the cutouts 18. The cutouts 18 can also be used as position-adjusting slots during the positioning of the MI device 1. If a coil wound around a bobbin is prepared as the coil 22, the coil 22 and the MI device 1 can readily be assembled merely by fitting the coil 22 onto the MI device 1.

A magnetic-field detecting operation will be described below.

If a high-frequency drive current of MHz frequency band, for example a high-frequency current generated by a Colpitts oscillation circuit which will be described later, is applied to the magnetic film 12 through the terminals 14 of the MI device 1, the impedance between both ends of the magnetic film 12 varies owing to an external magnetic field. The MI device 1 converts this variation into an electrical signal and provides a detection output of the external magnetic field.

Figure 3A:
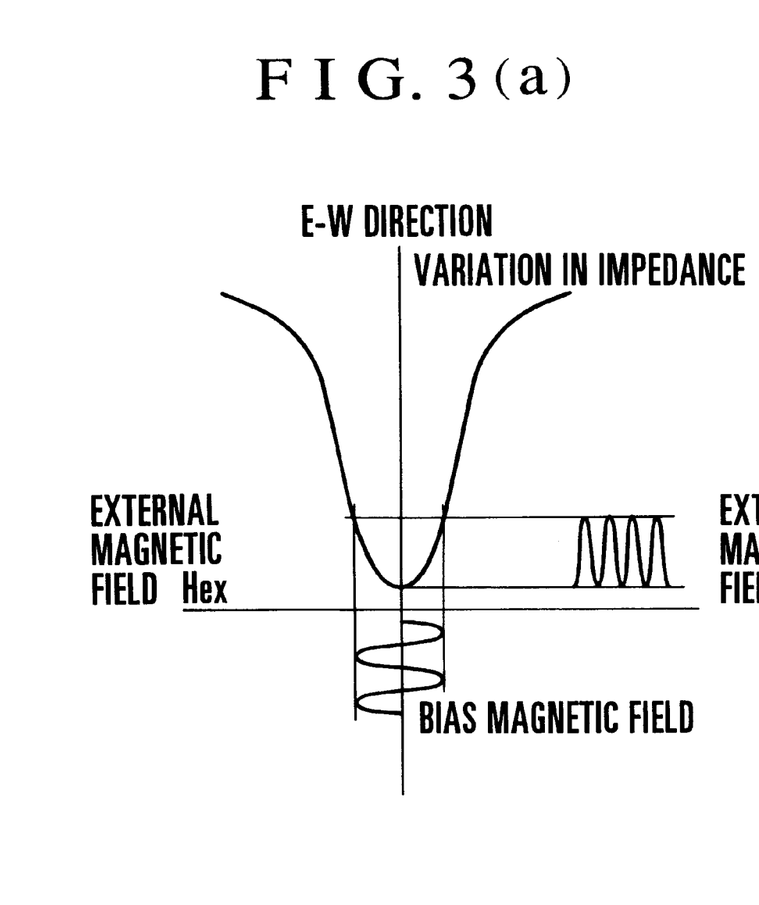
FIGS. 3(a) and 3(b) are graphs showing variations due to terrestrial magnetism in the output signal of the MI device exposed to an alternating-current bias magnetic field.
Figure 3B:
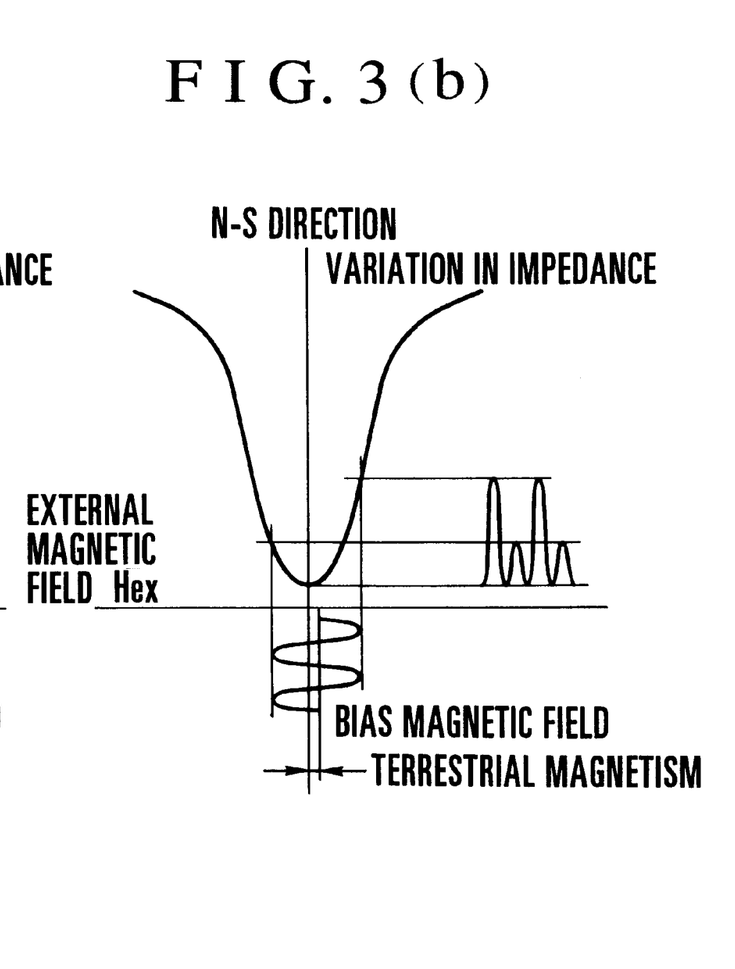

The MI device 1 on the azimuth sensor exhibits approximately V-shaped characteristics symmetrical in the positive and negative directions within the range of several Oe (oersteds) with respect to an external magnetic field Hex, as shown in FIGS. 3(a) and 3(b).

The bias coil 22 is wound around the MI device 1 mounted on the printed circuit board 16, in the above-described manner, and an alternating bias current having a frequency lower than the high-frequency drive current of the MI device 1 is made to flow through this coil 22 to apply an alternating-current bias magnetic field to the MI device 1. It is preferable to select the frequency of the alternating bias current to be not less than 1 kHz in terms of the response speed, and not greater than 1 MHz in terms of the frequency characteristics of the device.

If the external magnetic field is absent, i.e., the longitudinal direction of the MI device 1 is made parallel to the direction of the east-west axis, the bias magnetic field due to the coil 22 oscillates symmetrically in the positive and negative directions, as shown in FIG. 3(a), and the corresponding variation in the impedance appears as a symmetrical waveform having a frequency of two times the frequency of the alternating bias current. In contrast, if terrestrial magnetism is applied to the MI device 1 with the longitudinal direction of the MI device 1 being made parallel to the direction of the north-south axis, the bias magnetic field shifts correspondingly, as shown in FIG. 3(b), and the corresponding variation in the impedance appears as a waveform signal whose peaks alternate between different heights.

In other words, in the present invention, a magnetic field is detected by converting the strength of an external magnetic field into a difference in height between adjacent peaks which result from a variation in the impedance of the MI device. The difference in height between adjacent peaks is processed by the circuit of a magnetism sensor which will be described later. An example of the circuit is shown in FIG. 4.

Figure 4:
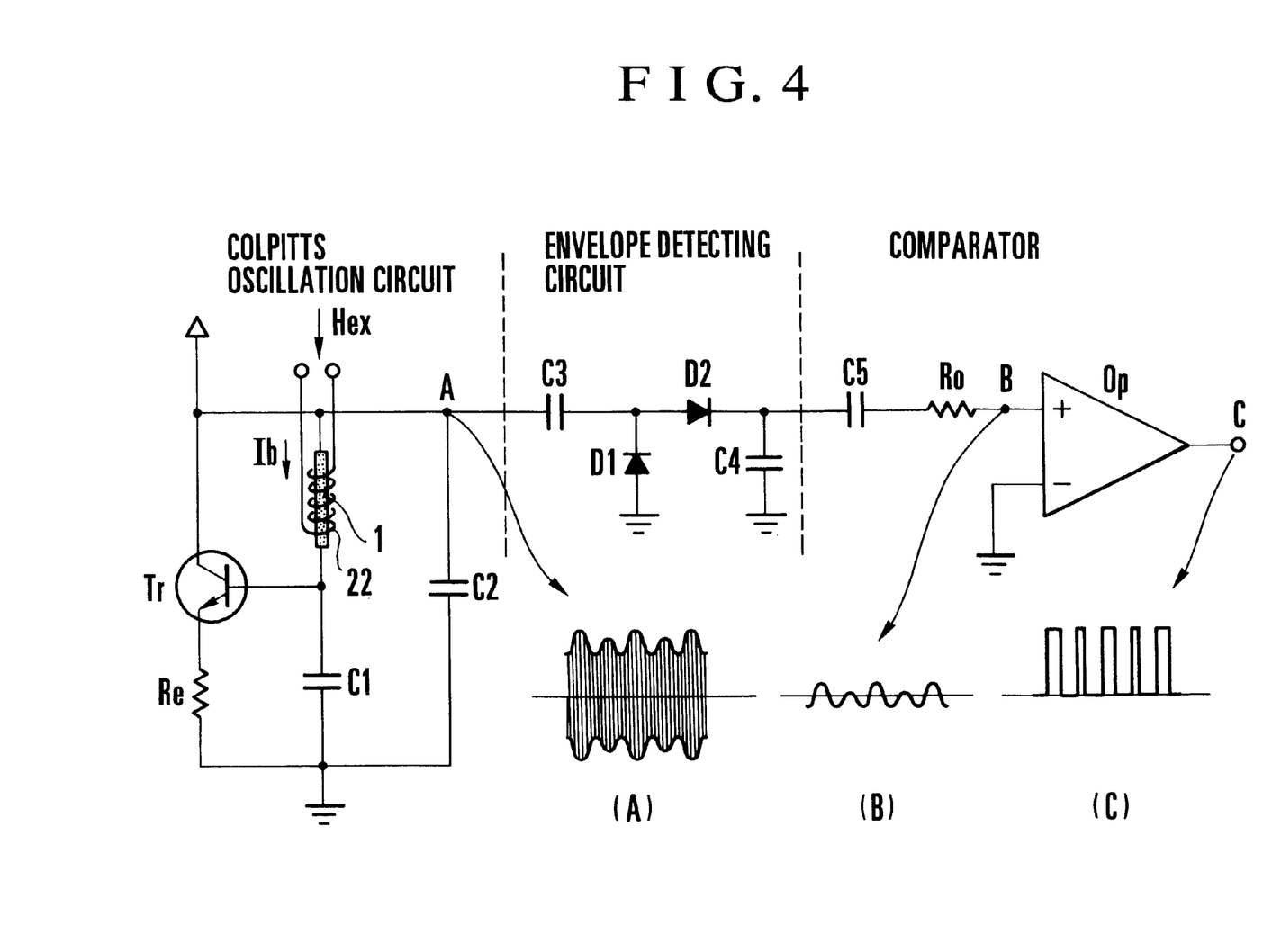
FIG. 4 is a circuit diagram showing an example of the magnetism sensor according to the present embodiment.

The circuit of the magnetism sensor shown in FIG. 4 is composed of the aforementioned Colpitts oscillation circuit, an envelope detecting circuit and a comparator. In this circuit, the MI device 1 around which the coil 22 is wound is incorporated in the Colpitts oscillation circuit, and the oscillation frequency of the Colpitts oscillation circuit is determined by the capacitors C1 and C2. Normally, a frequency which can provide an optimum oscillation is selected from among frequencies of 10 MHz to 100 MHz. A resistance Re for varying conditions for oscillation is connected to the emitter of a transistor Tr of the Colpitts oscillation circuit, and as the resistance value of the resistance Re is varied, the oscillation amplitude value varies.

Figure 5A:
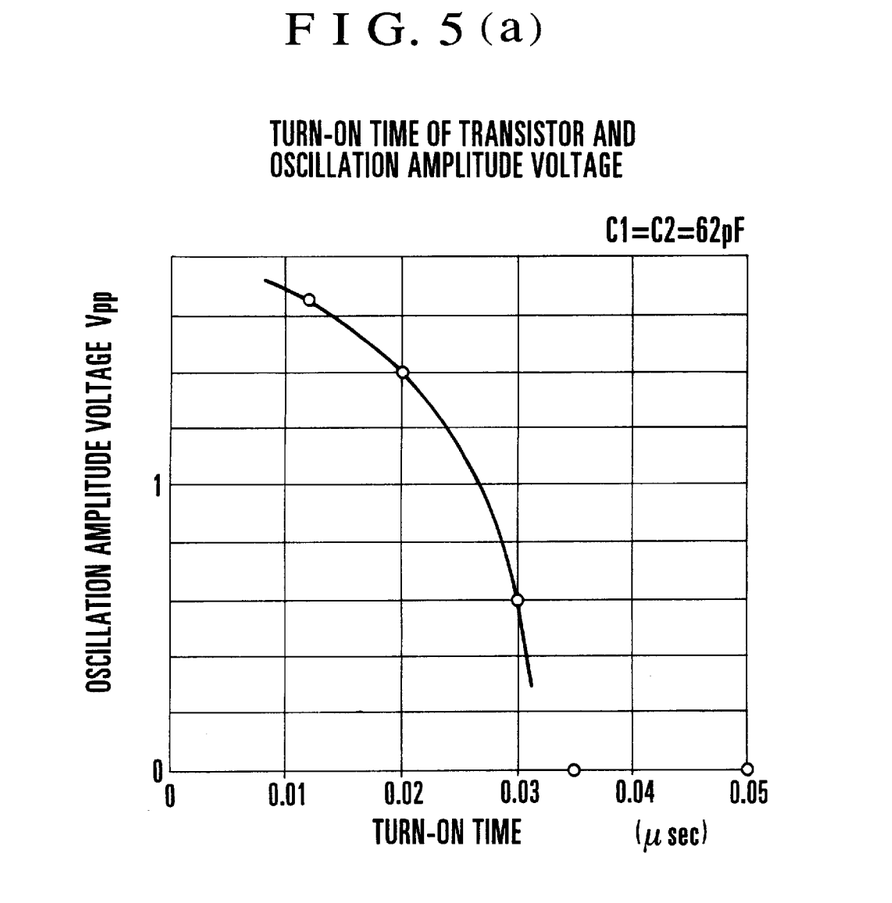
FIG. 5(a) is a graph showing the relation between an oscillation amplitude voltage and the turn-on time of a transistor in the Colpitts oscillation circuit shown in FIG. 4.
Figure 5B:
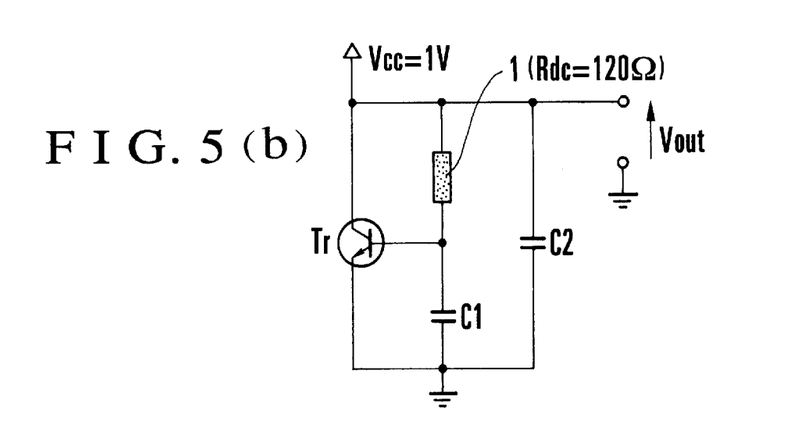
FIG. 5(b) is a circuit diagram of a measuring circuit.

FIG. 5(a) shows the relation between the turn-on time of the transistor Tr and an oscillation amplitude voltage Vpp in the above-described Colpitts oscillation circuit. As shown in FIG. 5(b), in the Colpitts oscillation circuit, a source voltage Vcc was set to 1 V, a direct-current resistance value Rdc of the MI device 1 was set to 120 $\Omega$, and the capacitance of each of the capacitors C1 and C2 was set to 62 pF. As can be seen from FIG. 5(a), as the turn-on time becomes longer than 0.03 $\mu$sec, the oscillation amplitude voltage becomes steeply lower. For this reason, a high-speed switching transistor having a turn-on time of not greater than 0.03 $\mu$sec is used as the transistor Tr.

Referring again to FIG. 4, if an external magnetic field is present, an amplitude-modulated waveform whose amplitude alternates between two different peaks from cycle to cycle as shown at (A) is obtained at a point A of FIG. 4 which is the output terminal of the Colpitts oscillation circuit. The higher peak corresponds to the case in which the bias magnetic field swings to its maximum in the same direction as the external magnetic field, whereas the lower peak corresponds to the case in which the bias magnetic field swings to the maximum in the direction opposite to the external magnetic field.

Then, only a ripple component is extracted from the amplitude-modulated wave (A) by the envelope detecting circuit which includes diodes D1 and D2 and capacitors C3 and C4, and in the comparator a direct-current component is eliminated from the ripple component by a capacitor C5 and the resultant alternating-current component is inputted to the positive input terminal of an operational amplifier Op via a resistance Ro. Its input waveform is shown at (B). The present embodiment adopts a method of eliminating a direct-current component and detecting zero crossings in an alternating-current component, but even if the elimination of a direct-current component is omitted, a similar function can be realized by matching the level of a comparative voltage for the comparator to the central axis of a ripple component outputted after envelope detection.

The magnetism detecting method according to the present invention, which is executed in the circuit of the magnetism sensor shown in FIG. 4, is not affected by variations in source voltage or the temperature characteristics of other electrical elements. The reason for this is as follows.

Figure 6:
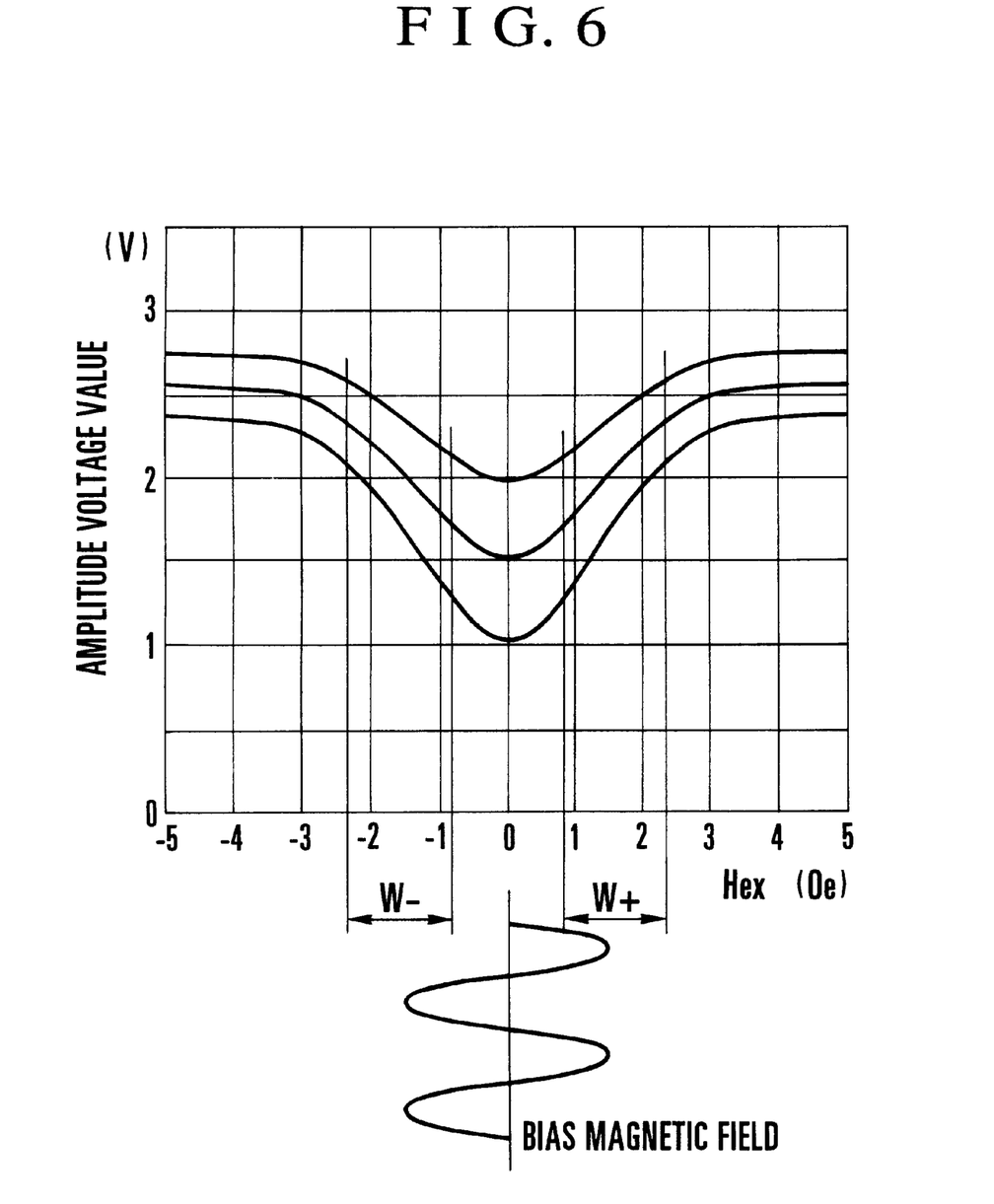
FIG. 6 is a graph showing variations in an amplitude voltage value which occur when an emitter-side resistance in the Colpitts oscillation circuit shown in FIG. 4 is changed for another resistance to vary an amplitude voltage and a uniform magnetic field is applied to the Colpitts oscillation circuit.

FIG. 6 shows data indicative of variations in the amplitude voltage value of the Colpitts oscillation circuit shown in FIG. 4. The data shown in FIG. 6 is obtained by changing the resistance Re connected to the emitter of the transistor Tr for another resistance to vary the amplitude voltage, and applying a uniform magnetic field to the Colpitts oscillation circuit in a Helmholtz coil. If the coil 22 is to be operated, the alternating bias current is set so that positive and negative peaks are respectively accommodated in ranges W+ and W− of the graph of FIG. 6 in each of which the amplitude voltage value varies to a great extent. As can be seen from FIG. 2(a), curves indicative of the respective data have slopes approximately parallel to each other irrespective of the setting of the amplitude voltage value. In other words, even if the amplitude voltage varies to some extent owing to variations in source voltage or the temperature characteristics of other electrical elements, the detection of an external magnetic field according to the present invention is not at all affected by the variations in the amplitude voltage, because the direct-current component of the output of the Colpitts oscillation circuit is eliminated and only the variation component of its amplitude is extracted.

This feature is advantageous in circuit adjustment. Since the amount of variation in amplitude is handled, no fine adjustment of the oscillation circuit is needed, because the absolute value of amplitude does not directly affect the sensitivity of the magnetism sensor.

Referring back to FIG. 4, the operational amplifier Op of the comparator detects zero crossings of the input signal voltage and outputs a signal (C) having a pulse-width-modulated digital waveform.

In this manner, the magnetism sensor is capable of converting the external magnetic field into the digital waveform signal which alternately varies between two different pulse widths. This magnetism sensor has the advantage that since the sensor output is obtained as a digital waveform, it is insusceptible to noise, and the connection portion of the MI device 1 shown in FIG. 4 and the succeeding signal processing circuit can freely be spaced fully apart from each other.

Incidentally, in the arrangement of the magnetism sensor shown in FIG. 4, the MI device 1 is not limited to only the type shown in FIG. 1, and even if other types of MI devices are employed, similar magnetic-field detection can, of course, be effected. Specifically, other types of MI devices having a magnetic film formed in a pattern different from that shown in FIG. 1 may be employed in place of the MI device 1, or an amorphous wire may be employed in place of such magnetic film. However, since amorphous wire involves the above-described problem of handling or the like, MI devices of the type shown in FIG. 1 are far more suitable for use in azimuth sensors.

A terrestrial-magnetism detecting azimuth sensor including the above-described magnetism sensor will be described below. This azimuth sensor is provided with two magnetism sensors each having the circuit shown in FIG. 4, and two MI devices 1 are disposed in such a manner that their longitudinal directions are perpendicular to each other, as shown in a right-hand top portion of FIG. 7, so that the two MI devices 1 can provide outputs relative to the X- and Y-axis directions, respectively.

Figure 7:
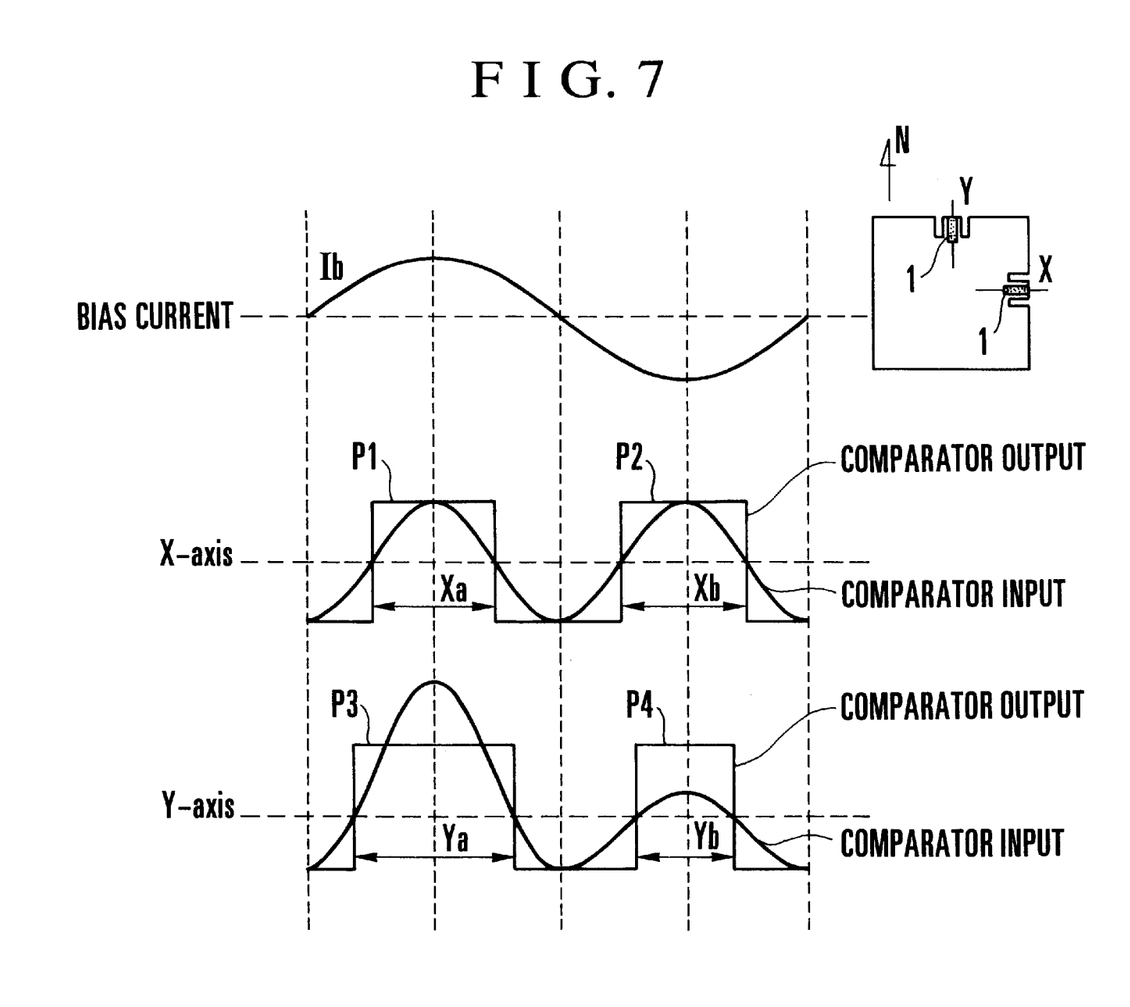
FIG. 7 is a waveform diagram showing an alternating bias current in an azimuth sensor including two magnetic sensors of the type shown in FIG. 4 and the input and output waveforms of each of X- and Y-axis comparators.

In this arrangement, as shown in FIG. 7, comparator input and output waveforms are provided along each of the X- and Y-axes with respect to an alternating bias current Ib which flows through the two MI devices 1. In FIG. 7, there are shown waveforms which are obtained with the two MI devices 1 being disposed in such a manner that the X and Y axes are respectively parallel to the direction of the east-west axis and the direction of the north-south axis.

In the circuit of the azimuth sensor, the two magnetism sensor circuits are followed by a computing circuit for processing the X- and Y-axis comparator outputs shown in FIG. 7. In this computing circuit, a difference Xa −Xb between the pulse widths of two adjacent pulses P1 and P2 in the X-axis comparator output is converted into a digital value N(Xa−Xb)=Nx, as by counting of clock pulses or the like, a difference Ya−Yb between the pulse widths of two adjacent pulses P3 and P4 in the Y-axis comparator output is converted into a digital value N(Ya−Yb) =Ny in a similar way, and an azimuth angle is calculated from the following calculating expression:

$$\tan^{-1}(Ny/Nx).$$

Figure 8:
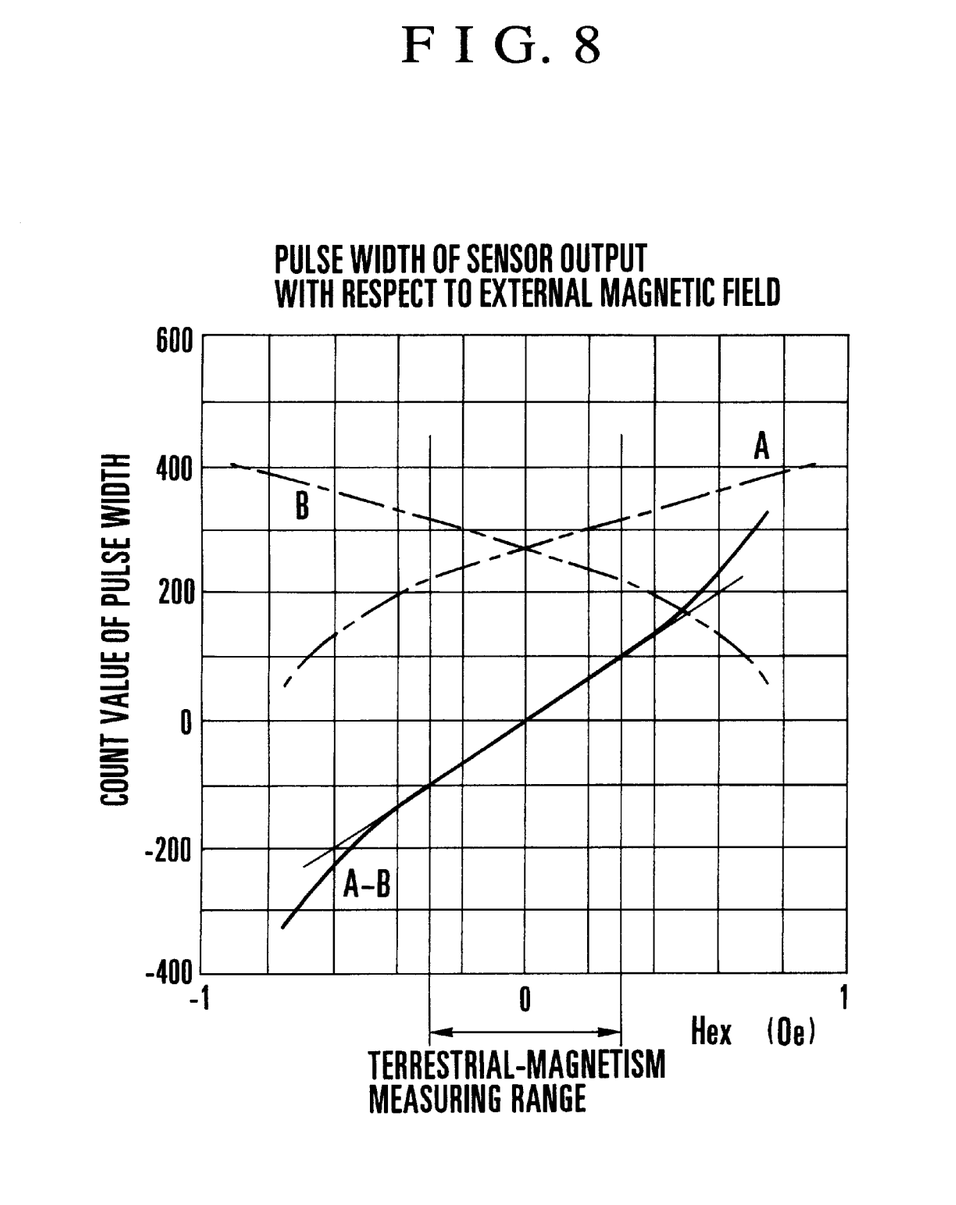
FIG. 8 is a graph showing data obtained by actually measuring the count values of pulse widths outputted from the azimuth sensor of FIG. 7 with respect to an external magnetic field.

FIG. 8 shows the data obtained by actually measuring the output of a sensor according to the present embodiment. In this sensor, a device using an Fe—Ta—C microcrystalline magnetic film was employed as the MI device 1, and its direct-current resistance was set to 150 Ω. The coil 22 had 40 turns, and an alternating bias current was made to flow through the coil 22 at 20 mApp in the form of a sine-wave signal of 20 kHz. The oscillation frequency of the Colpitts oscillation circuit was set to 35 MHz, and the pulse count clock frequency of the computing circuit was set to 20 MHz. In measurement, variations in the pulse width of the sensor output were examined while varying a magnetic field of ±1 Oe in a Helmholtz coil.

In FIG. 8, a curve A corresponds to the pulse width xa or Ya of FIG. 7, while a curve B corresponds to the pulse width Xb or Yb of FIG. 7. If the magnitude of the magnetic field is increased, either one of the pulse widths A and B vanishes. In the graph of FIG. 8, approximately −0.8 Oe and approximately +0.8 Oe correspond to the vanishing point of the pulse width A and the vanishing point of the pulse width B, respectively. These vanishing points vary depending on the magnitude of the bias current or the magnitude of the emitter-side resistance Re shown in FIG. 4, and can be adjusted by varying the magnitude of a ripple of an oscillation waveform.

If such vanishing points are set at values of as small as approximately ±0.1 Oe, detection sensitivity (inclination) to external magnetic fields can be increased within a narrow measurement range, whereby a magnetism sensor having a very high sensitivity can readily be realized.

The magnetism sensor can serve its function by using either one of the data A and B, but by handling data A-B, it becomes possible to identify the polarity of a magnetic field or ensure a far wider linear area.

With the curve A-B, it is not necessary to make special offset adjustment of the circuit of the magnetism sensor and it is possible to specify an origin. If a magnetism sensor, whose output pulse width varies linearly within a range of ±0.3 Oe which is required for measurement of terrestrial magnetism and whose X- and Y-axes are perpendicular to each other, is prepared, an azimuth angle can be calculated far more accurately from a $\tan^{-1}$ function.

The magnetism sensor shown in FIG. 4 can also be applied to not only the terrestrial-magnetism detecting azimuth sensor but also an attitude controlling sensor which is based on a uniform magnetic field, such as terrestrial magnetism. In this case, the printed circuit board on which the MI device 1 and the coil 22 are mounted to constitute part of the magnetism sensor is fixed to an object which is a target to be attitude-controlled. If the longitudinal direction of the MI device 1 coincides with a direction perpendicular to an external magnetic field according to the attitude of the object, the pulse widths of pulses which are alternately provided at the output of the magnetism sensor, i.e., the comparator output, become equal to each other, and if the longitudinal direction of the MI device 1 deviates from the aforesaid perpendicular direction, the aforesaid pulse widths become different from each other.

Accordingly, by performing attitude control so as to make the aforesaid pulse widths equal to each other, it is possible to effect attitude control based on a uniform magnetic field. This attitude control can be realized by the process of separately extracting the pulses which are alternately provided at the output of the aforesaid magnetism sensor, subjecting each of the extracted pulses to processing, such as the processing of computing the mean values of its integral, to produce a servo signal, and output this servo signal to an attitude control system. The attitude control system performs the attitude control according to the servo signal so that the aforesaid pulse widths become equal to each other, i.e., the longitudinal direction of the MI device coincides with a direction perpendicular to the external magnetic field.

The magnetism sensor of FIG. 4 is useful in various other applications. For example, because of its high detection sensitivity, the magnetism sensor can be applied to a distance measuring sensor which employs a small magnet, or because of its capability to detect the polarity of a magnetic field, the magnetism sensor can be applied to a sensor for detecting the rotation of a magnet at a remote location.

As is apparent from the foregoing description, in accordance with the MI device of the present embodiment, MI devices can be miniaturized like chip resistors or chip capacitors, so that magnetism sensors using such MI devices can be miniaturized. In addition, since MI devices can be directly soldered to printed circuit boards, mounting of MI devices to printed circuit boards and hence handling of MI devices is facilitated, so that it is possible to provide MI devices suitable for magnetism sensors used in azimuth sensors or the like.

In accordance with the magnetism sensor of the present embodiment, the strength of an external magnetic field is obtained not from the output of an MI device, specifically, the absolute value of the amplitude of an output from an oscillation circuit in which the MI device is incorporated, but from a variation component in the amplitude, so that it is possible to suppress the influence of variations in a source voltage or that of the temperature characteristics of other electrical elements. In addition, since no fine adjustment of the oscillation circuit is needed, an adjustment step in a manufacturing process can be simplified and productivity can be improved. In addition, since the MI device is insusceptible to noise, an MI device portion can be operated at a location away from the succeeding signal processing circuit without any problem, so that a location at which to install the MI device can freely be set.

In addition, the magnetism sensor of the present embodiment having the above-described superior features can be used to constitute a superior terrestrial-magnetism detecting azimuth sensor capable of detecting weak terrestrial magnetism with high sensitivity and accurately detecting an azimuth, and a superior attitude control system arranged to produce a servo signal for attitude control which is based on a uniform magnetic field, such as terrestrial magnetism.

I claim:

1. A magnetism detecting device of a magnetic impedance effect type, comprising:
   a high-permeability magnetic film formed on a side of an approximately rectangular parallelepipedic, non-magnetic substrate,
   said high-permeability magnetic film being formed as a folded pattern having end portions extending in opposite directions and at least one folded portion disposed between said end portions, a longitudinal direction of said high-permeability magnetic film being parallel to a magnetic-field detecting direction and said high-permeability magnetic film being imparted magnetic anisotrophy so that a direction of an axis of easy magnification of said high-permeability film is perpendicular to the longitudinal direction of said high-permeability magnetic film in a film plane thereof; and conductive films formed at both ends of said high-permeability magnetic film as terminals, said high-permeability magnetic film and said conductive films being formed on the side of said non-magnetic substrate, which side is approximately perpendicular to a surface of a printed circuit board, so that said conductive films are directly soldered to a wiring pattern on said printed circuit board on which to mount said magnetism detecting device.

2. A magnetism detecting device according to claim 1, wherein said high-permeability magnetic film has a film thickness of 1 μm to 5 μm and a width of 10 μm to 100 μm.

3. A magnetism detecting device according to claim 2, wherein a direct-current resistance across both ends of said magnetic film is in a range of 70 Ω to 300 Ω.

4. A magnetism sensor, wherein said magnetism detecting device according to claim 3 is used, said magnetism detecting device being mounted on an end portion of said printed circuit board, cutouts being respectively formed near both sides of the end portion of said printed circuit board on which said magnetism detecting device is mounted, a coil being wound around said magnetism detecting device through said cutouts.

5. A magnetism detecting device according to claim 1, wherein a direct-current resistance across both ends of said magnetic film is in a range of 70 Ω to 300 Ω.

6. A magnetism sensor, wherein said magnetism detecting device according to claim 5 is used, said magnetism detecting device being mounted on an end portion of said printed circuit board, cutouts being respectively formed near both sides of the end portion of said printed circuit board on which said magnetism detecting device is mounted, a coil being wound around said magnetism detecting device through said cutouts.

7. A magnetism sensor, wherein said magnetism detecting device according to claim 1 is used, said magnetism detecting device being mounted on an end portion of said printed circuit board, cutouts being respectively formed near both sides of the end portion of said printed circuit board on which said magnetism detecting device is mounted, a coil being wound around said magnetism detecting device through said cutouts.

* * * * *

UNITED STATES PATENT AND TRADEMARK OFFICE
CERTIFICATE OF CORRECTION

PATENT NO. : 6,028,427
DATED : February 22, 2000
INVENTOR(S) : Masahiro Kawase

It is certified that error appears in the above-identified patent and that said Letters Patent is hereby corrected as shown below:

Col. 1, line 24, delete "flux gate" and insert -- fluxgate --.
Col. 2, line 54, delete "boardon" and insert -- board on --.

Signed and Sealed this

Seventeenth Day of April, 2001

NICHOLAS P. GODICI

Attest:

Attesting Officer

Acting Director of the United States Patent and Trademark Office